US010741308B2

(12) United States Patent
Hornung et al.

(10) Patent No.: US 10,741,308 B2
(45) Date of Patent: Aug. 11, 2020

(54) ELECTRICAL CABLE

(71) Applicant: TE CONNECTIVITY CORPORATION, Berwyn, PA (US)

(72) Inventors: Craig Warren Hornung, Harrisburg, PA (US); Chad William Morgan, Carneys Point, NJ (US)

(73) Assignee: TE CONNECTIVITY CORPORATION, Berwyn, PA (US)

( * ) Notice: Subject to any disclaimer, the term of this patent is extended or adjusted under 35 U.S.C. 154(b) by 0 days.

(21) Appl. No.: 16/381,183

(22) Filed: Apr. 11, 2019

(65) Prior Publication Data

US 2019/0348196 A1 Nov. 14, 2019

Related U.S. Application Data

(60) Provisional application No. 62/669,767, filed on May 10, 2018.

(51) Int. Cl.
*H01B 7/00* (2006.01)
*H01B 11/18* (2006.01)
(Continued)

(52) U.S. Cl.
CPC ..... *H01B 11/1895* (2013.01); *G02B 6/02395* (2013.01); *G02B 6/4416* (2013.01); *H01B 7/0208* (2013.01); *H01B 11/002* (2013.01); *H01B 11/22* (2013.01); *H01R 13/6592* (2013.01); *H05K 9/0098* (2013.01)

(58) Field of Classification Search
CPC .......... H01B 7/02; H01B 7/04; H01B 7/0208; H01B 11/02; H01B 11/04; H01B 11/22; H01B 11/195

USPC .......... 174/110 R, 112, 113 R, 117 R, 117 F, 174/117 FF
See application file for complete search history.

(56) References Cited

U.S. PATENT DOCUMENTS 3,340,353 A 9/1967 Mildner
3,439,111 A 4/1969 Miracle et al.
(Continued)

FOREIGN PATENT DOCUMENTS

CN 201327733 10/2009
CN 201359878 12/2009
(Continued)

OTHER PUBLICATIONS

IVG FIBER "Single-Mode Fibers" (1 page).
(Continued)

*Primary Examiner* — William H. Mayo, III

(57) ABSTRACT

An electrical cable includes a conductor assembly having a first conductor, a second conductor and an insulator surrounding the first conductor and the second conductor. The insulator has an outer surface. The conductor assembly extends along a longitudinal axis for a length of the electrical cable. The first conductor has a first core and a first conductive layer on the first core. The second conductor has a second core and a second conductive layer on the second core. The first and second cores are dielectric. The electrical cable includes a cable shield around the conductor assembly engaging the outer surface of the insulator and providing electrical shielding for the first and second conductors. The cable shield extends along the longitudinal axis.

24 Claims, 4 Drawing Sheets

(51) Int. Cl.

| | |
|---|---|
| *G02B 6/02* | (2006.01) |
| *H01B 11/22* | (2006.01) |
| *H05K 9/00* | (2006.01) |
| *H01B 7/02* | (2006.01) |
| *G02B 6/44* | (2006.01) |
| *H01R 13/6592* | (2011.01) |
| *H01B 11/00* | (2006.01) |

(56) References Cited

U.S. PATENT DOCUMENTS

| | | | |
|---|---|---|---|
| 4,221,926 A | 9/1980 | Schneider | |
| 4,596,897 A | 6/1986 | Gruhn | |
| 4,644,092 A | 2/1987 | Gentry | |
| 4,733,933 A * | 3/1988 | Pikulski | G01D 5/268 |
| | | | 385/12 |
| 4,863,576 A | 9/1989 | Collins et al. | |
| 5,142,100 A | 8/1992 | Vaupotic | |
| 5,329,064 A | 7/1994 | Tash et al. | |
| 5,349,133 A | 9/1994 | Rogers | |
| 5,574,815 A | 12/1996 | Kneeland | |
| 5,619,016 A | 4/1997 | Newmoyer | |
| 6,010,788 A | 1/2000 | Kebabjian et al. | |
| 6,403,887 B1 | 6/2002 | Kebabjian et al. | |
| 6,504,379 B1 | 1/2003 | Jackson | |
| 6,677,518 B2 | 1/2004 | Hirakawa et al. | |
| 6,731,849 B1 | 5/2004 | Singh et al. | |
| 7,314,998 B2 | 1/2008 | Amato et al. | |
| 7,790,981 B2 | 9/2010 | Vaupotic et al. | |
| 7,827,678 B2 | 11/2010 | Dion et al. | |
| 7,999,185 B2 | 8/2011 | Cases et al. | |
| 8,378,217 B2 | 2/2013 | Sugiyama et al. | |
| 8,381,397 B2 | 2/2013 | Dion et al. | |
| 8,440,910 B2 | 5/2013 | Nonen et al. | |
| 8,546,691 B2 | 10/2013 | Watanabe et al. | |
| 8,552,291 B2 | 10/2013 | Lingambudi et al. | |
| 8,575,488 B2 | 11/2013 | Sugiyama et al. | |
| 8,674,228 B2 | 3/2014 | Dion et al. | |
| 8,866,010 B2 | 10/2014 | Nonen et al. | |
| 8,981,216 B2 | 3/2015 | Grant et al. | |
| 8,993,883 B2 | 3/2015 | Kumakura et al. | |
| 9,064,621 B2 | 6/2015 | Kodama et al. | |
| 9,117,572 B2 | 8/2015 | Fukasaku | |
| 9,123,452 B2 | 9/2015 | Sugiyama et al. | |
| 9,123,457 B2 | 9/2015 | Kaga et al. | |
| 9,136,042 B2 | 9/2015 | Sugiyama et al. | |
| 9,142,333 B2 | 9/2015 | Kaga et al. | |
| 9,159,472 B2 | 10/2015 | Nordin et al. | |
| 9,214,260 B2 | 12/2015 | Ishikawa et al. | |
| 9,299,481 B2 | 3/2016 | Ishikawa et al. | |
| 9,349,508 B2 | 5/2016 | Nonen et al. | |
| 9,466,408 B2 | 10/2016 | Sugiyama | |
| 9,484,127 B2 | 11/2016 | Sugiyama et al. | |
| 9,548,143 B2 | 1/2017 | Sugiyama et al. | |
| 9,583,235 B2 | 2/2017 | Nonen et al. | |
| 9,660,318 B2 | 5/2017 | Sugiyama et al. | |
| 2001/0042632 A1 * | 11/2001 | Manov | H01B 11/1041 |
| | | | 174/36 |
| 2003/0150633 A1 | 8/2003 | Hirakawa et al. | |
| 2009/0074959 A1 | 3/2009 | Sezerman et al. | |
| 2010/0307790 A1 | 12/2010 | Okano | |
| 2011/0100682 A1 | 5/2011 | Nonen et al. | |
| 2011/0127062 A1 | 6/2011 | Cases et al. | |
| 2012/0024566 A1 | 2/2012 | Shimosawa et al. | |
| 2012/0080211 A1 | 4/2012 | Brown et al. | |
| 2012/0103651 A1 * | 5/2012 | Kim | H01B 11/1808 |
| | | | 174/102 R |
| 2012/0152589 A1 | 6/2012 | Kumakura et al. | |
| 2012/0227998 A1 | 9/2012 | Lindstrom et al. | |
| 2013/0175081 A1 | 7/2013 | Watanabe et al. | |
| 2013/0333913 A1 | 12/2013 | Nonen et al. | |
| 2014/0048302 A1 | 2/2014 | Nonen et al. | |
| 2014/0090883 A1 * | 4/2014 | Gundel | H01B 7/0838 |
| | | | 174/350 |
| 2014/0102783 A1 | 4/2014 | Nagahashi et al. | |
| 2014/0305676 A1 | 10/2014 | Sugiyama et al. | |
| 2015/0000954 A1 | 1/2015 | Nonen et al. | |
| 2015/0235742 A1 | 8/2015 | Fu et al. | |
| 2015/0255928 A1 | 9/2015 | Liptak et al. | |
| 2016/0111187 A1 | 4/2016 | Kodama | |
| 2016/0155540 A1 | 6/2016 | Matsuda et al. | |
| 2016/0276062 A1 * | 9/2016 | Kordecki | H01B 11/203 |
| 2016/0300642 A1 | 10/2016 | Kodama et al. | |
| 2016/0343474 A1 | 11/2016 | Nichols | |
| 2016/0372235 A1 | 12/2016 | Sugiyama et al. | |
| 2017/0103830 A1 | 4/2017 | Dettmer et al. | |

FOREIGN PATENT DOCUMENTS

| | | |
|---|---|---|
| CN | 102231303 | 11/2011 |
| CN | 203931605 | 11/2014 |
| CN | 105741965 | 7/2016 |
| JP | 2000040423 | 2/2000 |
| JP | 2001093357 | 4/2001 |
| JP | 2012009321 | 1/2012 |
| JP | 2012238468 | 12/2012 |
| JP | 2013038082 | 2/2013 |
| JP | 2013258009 | 12/2013 |
| JP | 2014038802 | 2/2014 |
| JP | 2014078339 | 5/2014 |
| JP | 2014099404 | 5/2014 |
| JP | 2014142247 | 8/2014 |
| JP | 2014154490 | 8/2014 |
| JP | 2014157709 | 8/2014 |
| JP | 2015076138 | 4/2015 |
| JP | 2015146298 | 8/2015 |
| JP | 2015204195 | 11/2015 |
| JP | 2015230836 | 12/2015 |
| JP | 2016015255 | 1/2016 |
| JP | 2016027547 | 2/2016 |
| JP | 2016072007 | 5/2016 |
| JP | 2016072196 | 5/2016 |
| JP | 2016110960 | 6/2016 |
| JP | 2016213111 | 12/2016 |
| WO | 96041351 | 12/1996 |

OTHER PUBLICATIONS

OZ OPTICS "Metalized Fibers" (4 pages).
Co-pending U.S. Appl. No. 15/925,265, filed Mar. 19, 2018.
Co-pending U.S. Appl. No. 15/969,264, filed May 2, 2018.
Co-pending U.S. Appl. No. 15/952,690, filed Apr. 13, 2018.
Co-pending U.S. Appl. No. 16/159,003, filed Oct. 12, 2018.
Co-pending U.S. Appl. No. 16/159,053, filed Oct. 12, 2018.
Co-pending U.S. Appl. No. 15/925,243, filed Mar. 19, 2018.

* cited by examiner

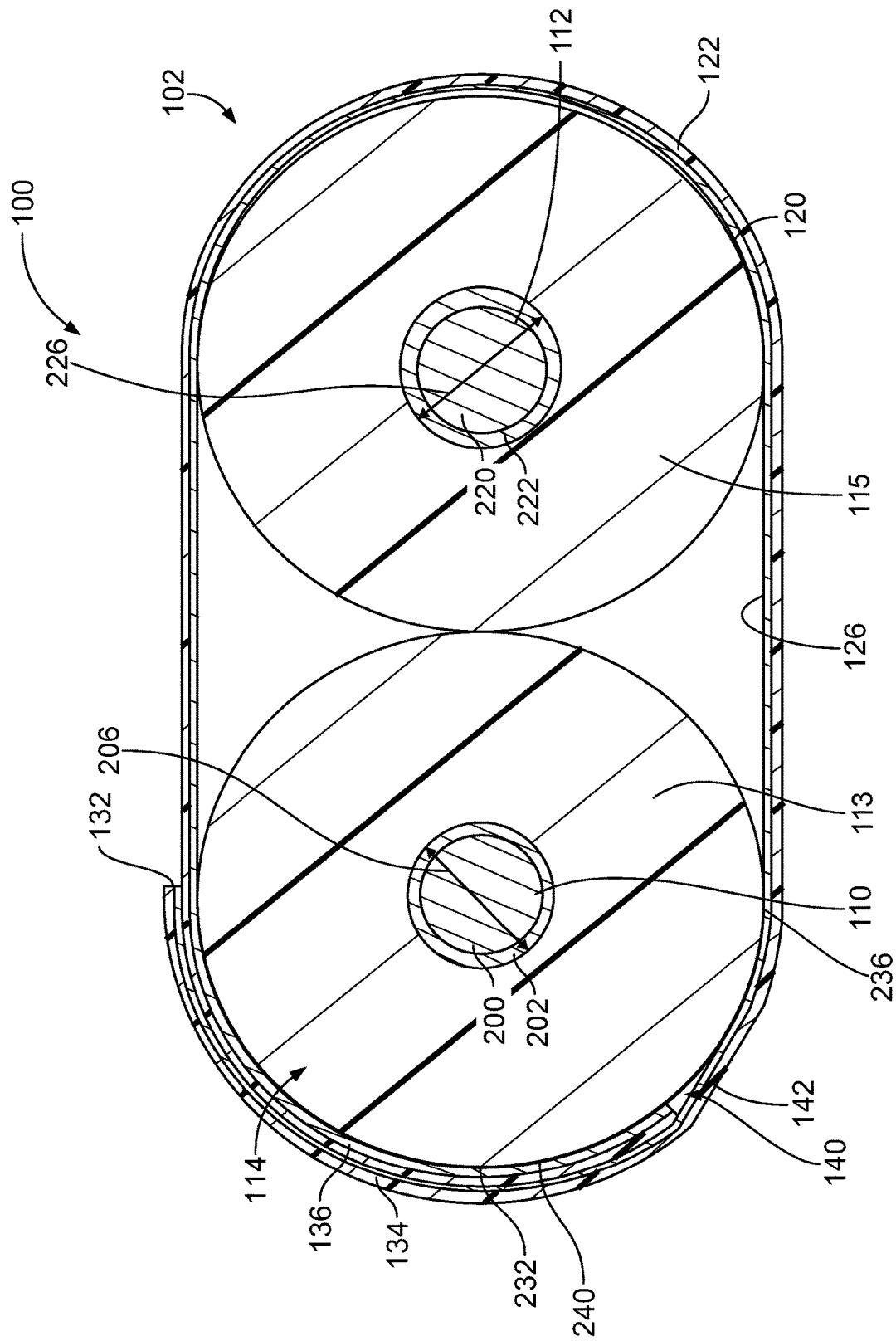

ELECTRICAL CABLE

CROSS REFERENCE TO RELATED APPLICATIONS

This application claims benefit to U.S. Provisional Application No. 62/669,767 filed May 10, 2018, titled "ELECTRICAL CABLE", the subject matter of which is herein incorporated by reference in its entirety.

BACKGROUND OF THE INVENTION

The subject matter herein relates generally to signal transmission electrical cables and shielding efficiency for signal conductors.

Shielded electrical cables are used in high-speed data transmission applications in which electromagnetic interference (EMI) and/or radio frequency interference (RFI) are concerns. Electrical signals routed through shielded cables radiate less EMI/RFI emissions to the external environment than electrical signals routed through non-shielded cables. In addition, the electrical signals being transmitted through the shielded cables are better protected against interference from environmental sources of EMI/RFI than signals through non-shielded cables.

Shielded electrical cables are typically provided with a cable shield formed by a tape wrapped around the conductor assembly. Signal conductors are typically arranged in pairs conveying differential signals. The signal conductors are surrounded by an insulator and the cable shield is wrapped around the insulator. However, manufacturing tolerances of the conductors and the insulator can lead to performance degradation in high speed signal cables. For example, differences in the diameters of the conductors leads to performance degradation in the form of electrical signal timing skew. It is desirable to have diameters of the conductors closely matched. Current manufacturers of drawn copper conductors have a manufacturing tolerance of +/−5 micrometers or microns (approximately 0.0002"). This amount of variation in the copper conductors drives signal integrity failures at high speeds resulting in marginal performance and increased scrap.

A need remains for an electrical cable that improves signal performance.

BRIEF DESCRIPTION OF THE INVENTION

In an embodiment, an electrical cable is provided including a conductor assembly having a first conductor, a second conductor and an insulator surrounding the first conductor and the second conductor. The insulator has an outer surface. The conductor assembly extends along a longitudinal axis for a length of the electrical cable. The first conductor has a first core and a first conductive layer on the first core. The second conductor has a second core and a second conductive layer on the second core. The first and second cores are dielectric. The electrical cable includes a cable shield around the conductor assembly engaging the outer surface of the insulator and providing electrical shielding for the first and second conductors. The cable shield extends along the longitudinal axis.

In another embodiment, an electrical cable is provided including a first conductor, a second conductor, an insulator and a cable shield. The first conductor includes a first fiber optic cable defining a first core having an outer surface. The first conductor has a first conductive layer applied to the outer surface of the first fiber optic cable. The second conductor has a second fiber optic cable defining a second core having an outer surface. The second conductor has a second conductive layer applied to the outer surface of the second fiber optic cable. The insulator surrounds the first conductor and the second conductor and engages the first and second conductive layers. The cable shield is provided around the insulator and engages the outer surface of the insulator and provides electrical shielding for the first and second conductors.

In a further embodiment, an electrical cable is provided including a first conductor, a second conductor, an insulator and a cable shield. The first conductor includes a first core having an outer surface having a first diameter and a first conductive layer applied to the outer surface of the first fiber optic cable. The second conductor has a second core having an outer surface having a second diameter and a second conductive layer applied to the outer surface of the second fiber optic cable. The first and second diameters have a tolerance less than +/−5 microns. The insulator surrounds the first conductor and the second conductor and engages the first and second conductive layers. The cable shield is positioned around the insulator engaging the outer surface of the insulator and providing electrical shielding for the first and second conductors.

BRIEF DESCRIPTION OF THE DRAWINGS

FIG. 6 is a cross-sectional view of the conductor assembly in accordance with an exemplary embodiment.

DETAILED DESCRIPTION OF THE INVENTION

Figure 1:
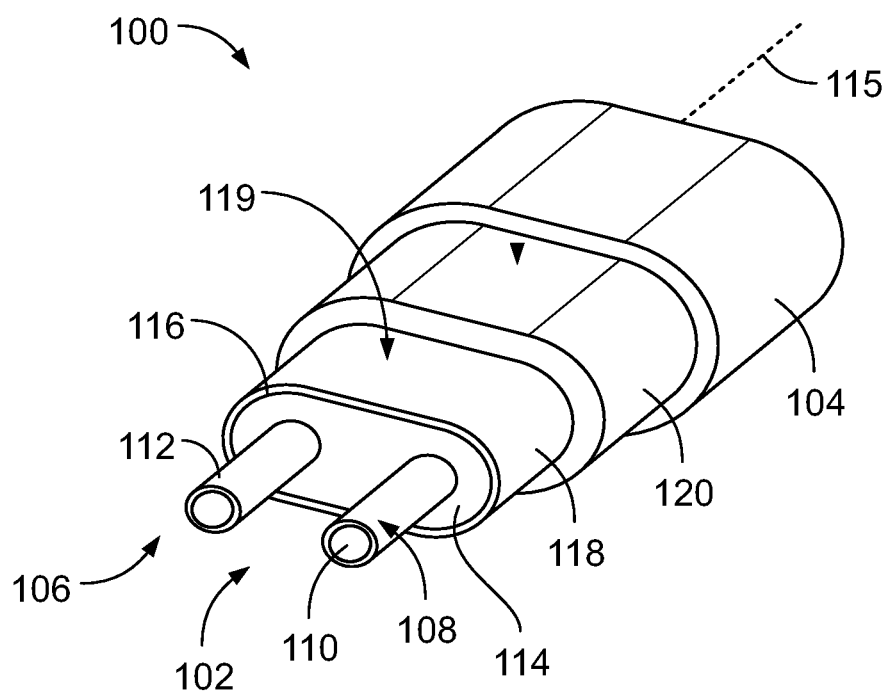
FIG. 1 is a perspective view of a portion of an electrical cable formed in accordance with an embodiment.

FIG. 1 is a perspective view of a portion of an electrical cable 100 formed in accordance with an embodiment. The electrical cable 100 may be used for high speed data transmission between two electrical devices, such as electrical switches, routers, and/or host bus adapters. The electrical cable 100 has a shielding structure configured to control capacitance and inductance relative to the signal conductors to control signal skew in the electrical cable 100 for high speed applications.

The electrical cable 100 includes a conductor assembly 102. The conductor assembly 102 is held within an outer jacket 104 of the electrical cable 100. The outer jacket 104 surrounds the conductor assembly 102 along a length of the conductor assembly 102. In FIG. 1, the conductor assembly 102 is shown protruding from the outer jacket 104 for clarity in order to illustrate the various components of the conductor assembly 102 that would otherwise be obstructed by the outer jacket 104. It is recognized, however, that the outer jacket 104 may be stripped away from the conductor assembly 102 at a distal end 106 of the cable 100, for example, to allow for the conductor assembly 102 to terminate to an electrical connector, a printed circuit board, or the like.

The conductor assembly 102 includes inner conductors arranged in a pair 108 that are configured to convey data signals. In an exemplary embodiment, the pair 108 of conductors defines a differential pair conveying differential signals. The conductor assembly 102 includes a first conductor 110 and a second conductor 112. In an exemplary embodiment, the conductor assembly 102 is a twin-axial differential pair conductor assembly. The conductors 110, 112 extend the length of the electrical cable 100 along a longitudinal axis 115.

The conductor assembly 102 includes an insulator 114 surrounding the conductors 110, 112. The insulator 114 is a monolithic, unitary insulator structure having an outer surface 116. In other various embodiments, the insulator 114 of the conductor assembly 102 includes first and second insulator members surrounding the first and second conductors 110, 112, respectively, which are separate, discrete components sandwiched together in the cable core of the electrical cable 100. For example, the conductors 110, 112 may be individually manufactured and extruded with their own insulator members that are then combined into the conductor assembly 102.

In various embodiments, the conductor assembly 102 includes a coating layer 118 on the outer surface 116 of the insulator 114. The coating layer 118 is conductive and defines an inner electrical shield 119 of the electrical cable 100. The coating layer 118 provides circumferential shielding around the pair 108 of conductors 110, 112 along the length of the electrical cable 100. In an exemplary embodiment, the coating layer 118 is applied directly to the outer surface 116. The coating layer 118 engages the outer surface 116. As used herein, two components "engage" or are in "engagement" when there is direct physical contact between the two components. The coating layer 118 is a direct metallization shield structure on the outer surface 116 of the insulator 114. The coating layer 118 conforms to the shape of the insulator 114 around the entire outer surface 116. The coating layer 118 is seamless along the length of the electrical cable 100. For example, the coating layer 118 does not include any seams or air gaps that are common with longitudinal or helical wraps. In an exemplary embodiment, the coating layer 118 is homogenous through a thickness of the coating layer 118. For example, the coating layer 118 may include conductive ink particles applied to the insulator 114, such as during an ink printing or other ink applying process. The conductive ink particles may be cured to form a homogenous coating layer. The coating layer 118 may include metal particles sprayed on the insulator 114, such as through a thermal spraying process. The coating layer 118 may be applied by other processes, such as a physical vapor deposition (PVD) process. The coating layer 118 may be applied in multiple passes or layers to thicken the coating layer 118. The coating layer 118 may be plated to build up the coating layer 118 on the insulator 114 in various embodiments. In other various embodiments, the conductor assembly 102 does not include the coating layer 118, but rather has other shielding structures to provide electrical shielding.

The conductor assembly 102 includes a cable shield 120 surrounding the insulator 114, and the coating layer 118 when present. The cable shield 120 provides circumferential shielding around the pair 108 of conductors 110, 112 along the length of the electrical cable 100. The cable shield 120 forms an outer electrical shield that provides electrical shielding for the conductors 110, 112. The cable shield 120 is exterior of the inner electrical shield 119. The cable shield 120 may engage the coating layer 118. In various embodiments, the cable shield 120 is electrically connected to the inner electrical shield 119.

The conductors 110, 112 extend longitudinally along the length of the cable 100. The conductors 110, 112 are formed of a conductive material, for example a metal material, such as copper, aluminum, silver, or the like that form electrical signal transmission paths for the conductors 110, 112. Optionally, the cores of the conductors 110, 112 may be fiber optic cores configured to convey optical signals in addition to the electrical signals conveyed by the conductive material of the conductors 110, 112. In an exemplary embodiment, each conductor 110, 112 may be a metalized dielectric conductor, rather than a solid or stranded conductor common in conventional electrical cables. Each conductor 110, 112 is fabricated by metallizing a dielectric core with conductive material that forms the corresponding signal transmission path. For example, the dielectric core may be a glass or plastic core and the metallization forms a conductive layer on the outer surface of the dielectric core. For example, the dielectric core may be an extruded plastic core. In various embodiments, the dielectric core is a fiber optic cable. The diameters of the dielectric cores may be tightly controlled during manufacturing to control the relative sizes of the conductive layers and the positioning of the conductive layers within the conductor assembly 102, such as to the cable shield 120 and/or the coating layer 118. By matching the sizes of the conductive layers to be within a tight tolerance window of each other, the inductance of the conductors 110, 112 may be matched in the conductors 110, 112 for electrical signal delay control (for example, skew control). The conductors 110, 112 extend generally parallel to one another along the length of the electrical cable 100.

The insulator 114 surrounds and engages outer perimeters of the corresponding first and second conductors 110, 112, such as the conductive outer layers of the conductors 110, 112. The insulator 114 is formed of a dielectric material, for example one or more plastic materials, such as polyethylene, polypropylene, polytetrafluoroethylene, or the like. The insulator 114 may be formed directly to the inner conductors 110, 112 by a molding process, such as extrusion, overmolding, injection molding, or the like. In an exemplary embodiment, the insulator 114 is co-extruded or dual extruded with both conductors 110, 112. The insulator 114 extends between the conductors 110, 112 and the cable shield 120. The insulator 114 maintains the conductor to conductor spacing and the conductor to shield spacing. For example, the insulator 114 separates or spaces the conductors 110, 112 from one another and separates or spaces the conductors 110, 112 from the coating layer 118 and/or the cable shield 120. The insulator 114 maintains separation and positioning of the conductors 110, 112 along the length of the electrical cable 100. The size and/or shape of the conductors 110, 112, the size and/or shape of the insulator 114, and the relative positions of the conductors 110, 112 may be modified or selected in order to attain a particular impedance and/or capacitance for the electrical cable 100. For example, the conductors 110, 112 may be moved relatively closer or relatively further from each other to affect electrical characteristics of the electrical cable 100. The inner electrical shield 119 may be moved relatively closer or relatively further from the conductors 110, 112 to affect electrical characteristics of the electrical cable 100.

The cable shield 120 surrounds the coating layer 118 and the insulator 114. The cable shield 120 is formed, at least in part, of a conductive material. In an exemplary embodiment, the cable shield 120 is a tape configured to be wrapped around the cable core. For example, the cable shield 120 may include a multi-layer tape having a conductive layer and an insulating layer, such as a backing layer. The conductive layer and the backing layer may be secured together by adhesive. Optionally, the cable shield 120 may include an adhesive layer, such as along the interior side to secure the cable shield 120 to the insulator 114 and/or itself. The conductive layer may be a conductive foil or another type of conductive layer. The insulating layer may be a polyethylene terephthalate (PET) film, or similar type of film. The conductive layer provides electrical shielding for the first and second conductors 110, 112 from external sources of EMI/RFI interference and/or to block cross-talk between other conductor assemblies 102 or electrical cables 100. In an exemplary embodiment, the electrical cable 100 includes a wrap or another layer around the cable shield 120 that holds the cable shield 120 on the insulator 114. For example, the electrical cable 100 may include a helical wrap. The wrap may be a heat shrink wrap. The wrap is located inside the outer jacket 104.

The outer jacket 104 surrounds and may engage the outer perimeter of the cable shield 120 or the heat shrink wrap. In the illustrated embodiment, the outer jacket 104 engages the cable shield 120 along substantially the entire periphery of the cable shield 120. The outer jacket 104 is formed of at least one dielectric material, such as one or more plastics (for example, vinyl, polyvinyl chloride (PVC), acrylonitrile butadiene styrene (ABS), or the like). The outer jacket 104 is non-conductive, and is used to insulate the cable shield 120 from objects outside of the electrical cable 100. The outer jacket 104 also protects the cable shield 120 and the other internal components of the electrical cable 100 from mechanical forces, contaminants, and elements (such as fluctuating temperature and humidity). Optionally, the outer jacket 104 may be extruded or otherwise molded around the cable shield 120. Alternatively, the outer jacket 104 may be wrapped around the cable shield 120 or heat shrunk around the cable shield 120.

Figure 2:
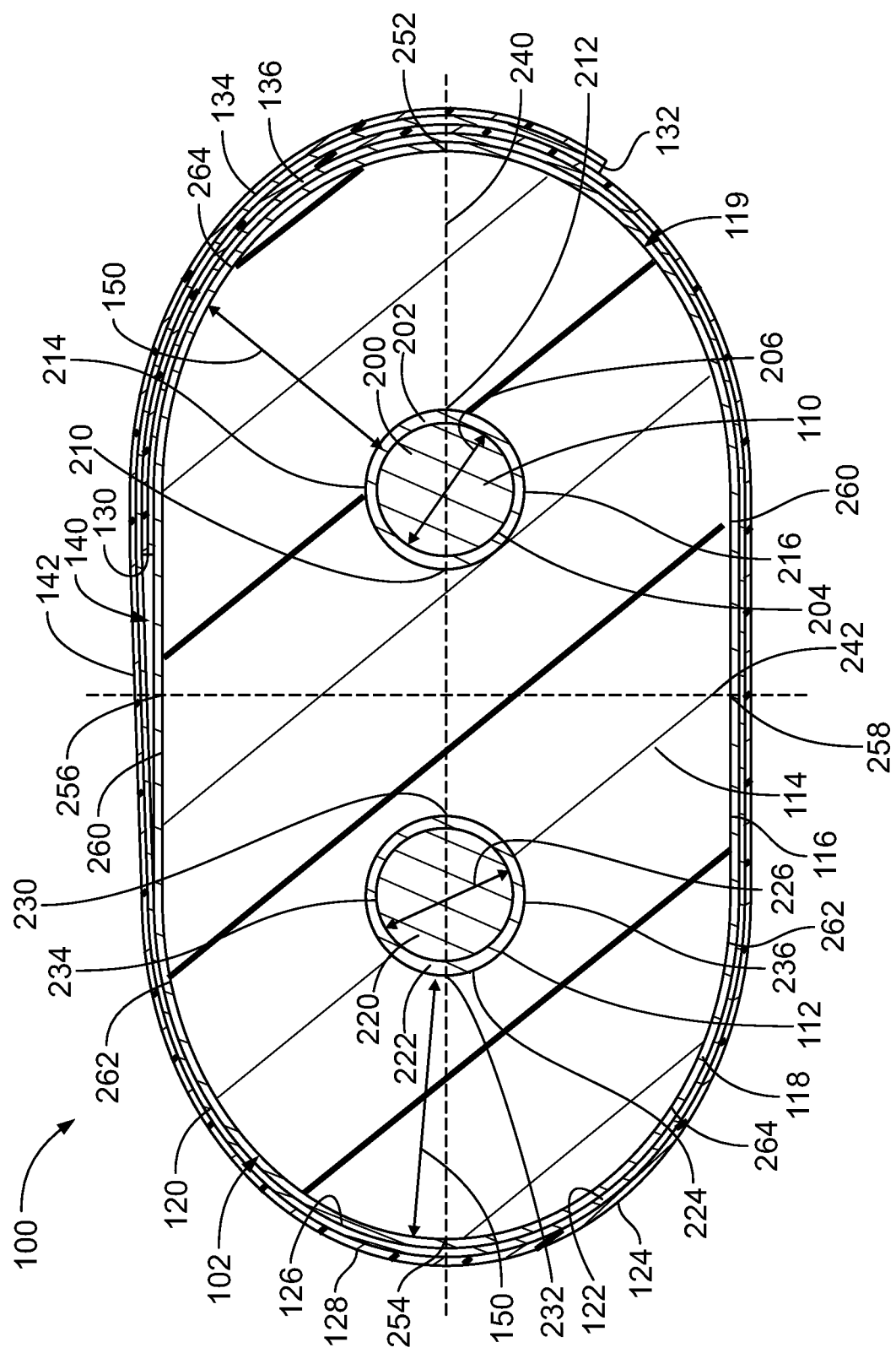
FIG. 2 is a cross-sectional view of a conductor assembly of the electrical cable in accordance with an exemplary embodiment.

FIG. 2 is a cross-sectional view of the conductor assembly 102 in accordance with an exemplary embodiment. The coating layer 118 is a direct metallization of the insulator 114 by applying the shield structure directly to the outer surface 116 of the insulator 114. The cable shield 120 is then wrapped around the coating layer 118 and the insulator 114 in the cable core as a secondary shield structure. The cable shield 120 may be electrically connected to the coating layer 118.

The cable shield 120 includes a conductive layer 122 and an insulating layer 124. In the illustrated embodiment, the conductive layer 122 is provided on an interior 126 of the cable shield 120 and the insulating layer 124 is provided on an exterior 128 of the cable shield 120 such that the conductive layer 122 may engage and be electrically connected to the coating layer 118. However, the conductive layer 122 may be provided on the exterior of the cable shield 120 in alternative embodiments, such as when the coating layer 118 is not provided.

The cable shield 120 includes an inner edge 130 and an outer edge 132. When the cable shield 120 is wrapped around the cable core, a flap 134 of the cable shield 120 overlaps the inner edge 130 and a segment 136 of the cable shield 120. The interior 126 of the flap 134 may be secured to the exterior 128 of the segment 136 along a seam, such as using adhesive or a heat shrink wrap around the entire cable shield 120. When the cable shield 120 is wrapped over itself to form the flap 134, a void 140 is created. The cable shield 120 may be wrapped such that the flap 134 is at the top and wrapping to the right side as in the illustrated embodiment. However, the cable shield 120 may be wrapped in other directions in alternative embodiments or at other positions in alternative embodiments.

In various embodiments, the void 140 is a pocket of air defined between the interior 126 of an elevated segment 142 of the cable shield 120 and the insulator 114. In other various embodiments, the void 140 may be filled with another material, such as adhesive or other dielectric material. The elevated segment 142 is elevated or lifted off of the insulator 114 to allow the flap 134 to clear the inner edge 130. The electrical cable 100 may be manufactured to reduce skew imbalance by locating the void 140 between the first and second conductors 110, 112. For example, the location of the void 140 may be selected to completely balance the skew effects of the void 140 on the first conductor 110 and on the second conductor 112 leading to a zero skew or near-zero skew effect. In various embodiments, the void 140 is generally centered between the conductors 110, 112. For example, the volume of air in the void 140 may be approximately centered between the conductors 110, 112 to minimize the detrimental effect of the air void 140 on either of the conductors 110, 112 over the other conductors 110, 112. Optionally, due to the shape of the void 140, the void 140 may be off-set from centered above the first and second conductors 110, 112, such as with the volumes of air in the void 140 being approximately centered between the first and second conductors 110, 112.

The coating layer 118 and/or the cable shield 120 provide circumferential shielding around the pair 108 of conductors 110, 112, such as at a shield distance 150 between the conductors 110, 112 and the shield structure. The distance 150 is generally defined by a thickness of the insulator 114. The shield distance 150 may be variable around the conductor assembly 102, such as due to the shape of the outer surface 116 and the positioning of the conductors 110, 112 within the insulator 114. The coating layer 118 and the cable shield 120 generally conform to the shape of the insulator 114 around the entire outer surface 116. In various embodiments, the direct metallization of the outer surface 116 of the insulator 114, which is defined by the coating layer 118, positions the shield structure interior of the air void 140 and at more uniform shield spacing from the conductors 110, 112. The coating layer 118 forms a conductive shell around the insulator 114 prior to wrapping the cable shield 120 around the cable core.

In an exemplary embodiment, the first conductor 110 includes a first core 200 and a first conductive layer 202 on the first core 200. The first core 200 is a dielectric core and the first conductive layer 202 defines the electrical signal transmission path for the first conductor 110. Optionally, the first core 200 may be a fiber optic core configured to convey optical signals along the length of the electrical cable 100 in addition to the electrical signals conveyed by the first conductive layer 202. The first core 200 defines a base layer or substrate to support the first conductive layer 202. In an exemplary embodiment, the first core 200 has a first core outer surface 204 having a circular cross-section of a first diameter 206. The first core 200 is manufactured from a dielectric material, such as a glass or plastic material. For example, the first core 200 may be an extruded plastic core. In an exemplary embodiment, the first core 200 is a fiber optic cable or manufactured by a similar process to manufacturing fiber optic cables. The first core outer surface 204 may be defined by a cladding of a fiber optic cable.

The first conductive layer 202 is a conductive layer. In various embodiments, the first conductive layer 202 may be a silver layer. In other various embodiments, the first conductive layer 202 may be a copper layer, an aluminum layer or another metal layer. The first conductive layer 202 engages the first core outer surface 204. In an exemplary embodiment, the first conductive layer 202 is built up directly on the first core outer surface 204. The first conductive layer 202 includes conductive particles forming a layer or coating on the first core 200.

In an exemplary embodiment, the first conductive layer 202 may include conductive particles applied to the first core 200 as a continuous coating on the first core outer surface 204. In various embodiments, the conductive particles are silver particles; however the conductive particles may be other metals or alloys in alternative embodiments. The conductive particles may be initially applied with non-conductive particles, such as binder material, some or all of which may be later removed, such as during a curing, drying or other process. For example, the conductive particles may be conductive ink particles applied by printing, spraying, bathing or other application processes. For example, the first conductive layer 202 may be a silver (or other metal, such as copper, aluminum and the like) ink coating applied to the first core 200. The coated material may be processed, for example, cured or partially cured, to form the first conductive layer 202. In various embodiments, the first conductive layer 202 may be applied using a dipping bath, such as in a metal bath solution, and processed with IR heating in one or more passes. In various embodiments, the coating material may be dissolved metal material that is applied and cured to leave metal crystals behind as the conductive particles. In an exemplary embodiment, the first conductive layer 202 is a homogenous coating layer. The first conductive layer 202 may be applied in multiple passes or layers to thicken the first conductive layer 202 to control the volume of conductive material in the first conductive layer 202. The layers may be fully cured between applications in various embodiments. The layers may be partially cured between applications in other alternative embodiments. In some embodiments, a dielectric layer (not shown) may be applied to the first conductive layer 202 to protect the first conductive layer 202 prior to extrusion with the insulator 114.

In other various embodiments, the conductive particles may be deposited by other processes. For example, in various embodiments, the first conductive layer 202 is plated on the first core 200. For example, a seed layer may be applied to the first core outer surface 204. The seed layer may be plated with a plating layer. The plating layer may be applied by electro-less plating or electroplating. In other various embodiments, the first conductive layer 202 may include metal particles sprayed on the first core 200, such as through a thermal spraying process. The metal particles may be heated and/or melted and sprayed onto the first core outer surface 204 to form the first conductive layer 202. When the metal particles are sprayed, the metal particles may be embedded into the first core outer surface 204 to secure the particles to the insulator 114. The metal particles may be heated to fuse the metal particles together on the first core 200 to form a continuous layer on the first core outer surface 204. Other processes may be used to apply the first conductive layer 202 to the first core 200, such as a physical vapor deposition (PVD) process. In various embodiments, the first conductive layer 202 is dip coated onto the first core 200, such as with a conductive ink. In other various embodiments, the first conductive layer 202 may be spray coated onto the first core 200.

Optionally, the first core 200 may be processed prior to application of the first conductive layer 202. For example, the first core outer surface 204 may be pre-treated with cleaning agents or other chemicals. The first core outer surface 204 may be processed with corona discharge to increase adhesion of the first conductive layer 202. The first conductive layer 202 may be processed after application, such as with heat or chemicals to cure the first conductive layer 202. The first conductive layer 202 may include multiple layers built up during processing, such as by multiple passes through one or more processing steps.

The first conductor 110 has an inner end 210 facing the second conductor 112 and an outer end 212 opposite the inner end 210. The first conductor 110 has a first side 214 (for example, a top side) and a second side 216 (for example, a bottom side) opposite the first side 214. The first and second sides 214, 216 are equidistant from the inner and outer ends 210, 212.

In an exemplary embodiment, the second conductor 112 includes a second core 220 and a second conductive layer 222 on the second core 220. The second core 220 is a dielectric core and the second conductive layer 222 defines the electrical signal transmission path for the second conductor 112. Optionally, the second core 220 may be a fiber optic core configured to convey optical signals along the length of the electrical cable 100 in addition to the electrical signals conveyed by the second conductive layer 222. The second core 220 defines a base layer or substrate to support the second conductive layer 222. In an exemplary embodiment, the second core 220 has a second core outer surface 224 having a circular cross-section of a second diameter 226. The second core 220 is manufactured from a dielectric material, such as a glass or plastic material. For example, the first core 220 may be an extruded plastic core.

In an exemplary embodiment, the second core 220 is a fiber optic cable or manufactured by a similar process to manufacturing fiber optic cables. The diameter 226 of the second core 220 may be tightly controlled during manufacturing to match the diameter 206 of the first core 200. In an exemplary embodiment, the manufacturing tolerance for the first and second cores 200, 220 is improved over the manufacturing tolerance for metal wire extrusion, such as less than +/−5 microns (0.0002") within targeted diameters. In various embodiments, the manufacturing tolerance for the first and second cores 200, 220 may be less than half of the manufacturing tolerance for metal wire extrusion, such as less than approximately +/−2.5 microns within targeted diameters. In an exemplary embodiment, the manufacturing tolerance for the first and second cores 200, 220 may be less than +/−1.0 microns within targeted diameters. For example, the manufacturing tolerance for the first and second cores 200, 220 may be approximately +/−0.7 microns (0.000027") within targeted diameters, which is approximately 7× better than typical manufacturing tolerances for copper metal extrusions (for example, approximately +/−5 microns (0.0002"), measured without undue scrapping or waste of manufactured material, which are commercially achievable tolerance levels. By tightly controlling the manufacturing tolerances of the first and second cores 200, 220, the diameters of the first and second conductors 110, 112 may be tightly matched to target diameters (for example, the same diameter in various embodiments) to provide matched substrates for forming the first and second conductive layers 202, 222 on the first and second cores 200, 220. In this way, the conductive elements of the first and second conductors 110, 112 may be closely matched to reduce delay or skew in the electrical cable 100. For example, the conductive elements, namely the first and second conductive layers 202, 222 may have approximately equal inductances leading to zero or near zero skew imbalance through the electrical cable 100.

The second conductive layer 222 is a conductive layer. In various embodiments, the second conductive layer 222 may be a silver layer. In other various embodiments, the second conductive layer 222 may be a copper layer, an aluminum layer or another metal layer. The second conductive layer 222 engages the second core outer surface 224. In an exemplary embodiment, the second conductive layer 222 is built up directly on the second core outer surface 224. The second conductive layer 222 includes conductive particles forming a layer or coating on the second core 220.

In an exemplary embodiment, the second conductive layer 222 may include conductive particles applied to the second core 220 as a continuous coating on the second core outer surface 224. In various embodiments, the conductive particles are silver particles; however the conductive particles may be other metals or alloys in alternative embodiments. The conductive particles may be initially applied with non-conductive particles, such as binder material, some or all of which may be later removed, such as during a curing, drying or other process. For example, the conductive particles may be conductive ink particles applied by printing, spraying, bathing or other application processes. For example, the second conductive layer 222 may be a silver (or other metal, such as copper, aluminum and the like) ink coating applied to the second core 220. The coated material may be processed, for example, cured or partially cured, to form the second conductive layer 222. In various embodiments, the second conductive layer 222 may be applied using a dipping bath, such as in a metal bath solution, and processed with IR heating in one or more passes. In various embodiments, the coating material may be dissolved metal material that is applied and cured to leave metal crystals behind as the conductive particles. In an exemplary embodiment, the second conductive layer 222 is a homogenous coating layer. The second conductive layer 222 may be applied in multiple passes or layers to thicken the second conductive layer 222. The layers may be fully cured between applications in various embodiments. The layers may be partially cured between applications in other alternative embodiments. In some embodiments, a dielectric layer (not shown) may be applied to the second conductive layer 222 to protect the second conductive layer 222 prior to extrusion with the insulator 114.

In other various embodiments, the conductive particles may be deposited by other processes. For example, in various embodiments, the second conductive layer 222 is plated on the second core 220. For example, a seed layer may be applied to the second core outer surface 224. The seed layer may be plated with a plating layer. The plating layer may be applied by electro-less plating or electroplating. In other various embodiments, the second conductive layer 222 may include metal particles sprayed on the second core 220, such as through a thermal spraying process. The metal particles may be heated and/or melted and sprayed onto the second core outer surface 224 to form the second conductive layer 222. When the metal particles are sprayed, the metal particles may be embedded into the second core outer surface 224 to secure the particles to the insulator 114. The metal particles may be heated to fuse the metal particles together on the second core 220 to form a continuous layer on the second core outer surface 224. Other processes may be used to apply the second conductive layer 222 to the second core 220, such as a physical vapor deposition (PVD) process. In various embodiments, the second conductive layer 222 is dip coated onto the second core 220, such as with a conductive ink. In other various embodiments, the second conductive layer 222 may be spray coated onto the second core 220.

Optionally, the second core 220 may be processed prior to application of the second conductive layer 222. For example, the second core outer surface 224 may be pre-treated with cleaning agents or other chemicals. The second core outer surface 224 may be processed with corona discharge to increase adhesion of the second conductive layer 222. The second conductive layer 222 may be processed after application, such as with heat or chemicals to cure the second conductive layer 222. The second conductive layer 222 may include multiple layers built up during processing, such as by multiple passes through one or more processing steps.

The second conductor 112 has an inner end 230 facing the first conductor 110 and an outer end 232 opposite the inner end 230. The second conductor 112 has a first side 234 (for example, a top side) and a second side 236 (for example, a bottom side) opposite the first side 234. The first and second sides 234, 236 are equidistant from the inner and outer ends 230, 232.

The conductor assembly 102 extends along a lateral axis 240 bisecting the first and second conductors 110, 112, such as through the inner ends 210, 230 and the outer ends 212, 232. Optionally, the lateral axis 240 may be centered in the insulator 114. The conductor assembly 102 extends along a transverse axis 242 centered between the first and second conductors 110, 112, such as centered between the inner ends 210, 230 of the first and second conductors 110, 112. Optionally, the transverse axis 242 may be centered in the insulator 114. In an exemplary embodiment, the transverse axis 242 is located at the magnetic center of the cable core between the first and second conductors 110, 112. In an exemplary embodiment, the longitudinal axis 115 (shown in FIG. 1), the lateral axis 240 and the transverse axis 242 are mutually perpendicular axes. In an exemplary embodiment, the insulator 114 is symmetrical about the lateral axis 240 and the transverse axis 242. In an exemplary embodiment, the coating layer 118, which is applied directly to the outer surface 116 of the insulator 114, is symmetrical about the lateral axis 240 and the transverse axis 242.

In an exemplary embodiment, the outer surface 116 has a generally elliptical or oval shape defined by a first end 252, a second end 254 opposite the first end 252, a first side 256 (for example, a top side) and a second side 258 (for example, a bottom side) opposite the first side 256. The first and second sides 256, 258 may have flat sections 260 and may have curved sections 262, such as at the transitions with the first and second ends 252, 254. The first and second ends 252, 254 have curved sections 264 that transition between the first and second sides 256, 258. The material of the insulator 114 between the conductors 110, 112 and the outer surface 116 has a thickness. Optionally, the thickness may be uniform. Alternatively, the thickness may vary, such as being narrower at the first and second sides 256, 258 and being widest at the centroids of the first and second ends 252, 254.

The insulator thickness defines the shield distance 150 between the coating layer 118 and/or the cable shield 120 and the corresponding conductors 110, 112. The shield distance 150 affects the electrical characteristics of the signals transmitted by the conductors 110, 112. For example, the shield distance 150 may affect the delay or skew of the signal, the insertion loss of the signal, the return loss of the signal, and the like. The dielectric material between the shield structure and the corresponding conductors 110, 112 affects the electrical characteristics of the signals transmitted by the conductors 110, 112. The effects of the air void 140 are significantly reduced if not entirely eliminated by locating the coating layer 118 interior of the air void 140. The effects of the air void 140 are significantly reduced if not entirely eliminated by locating the air void 140 approximately centered above the first and second conductors 110, 112, such as aligned with the transverse axis 242.

In other various embodiments, such as when the air void 140 is offset relative to the conductors 110, 112 (for example, closer to the first conductor 110 and further from the second conductor 112), the diameters of the conductors 110, 112 may be intentionally made differently to compensate for the effects of the air void 140 to balance the skew effects. For example, the presence of the air void 140 closer to the first conductor 110 may affect capacitance of the first conductor 110 relative to the second conductor 112 and thus the diameter of the first conductor 110 may be different than (for example, smaller than) the diameter of the second conductor 112 to increase the inductance of the first conductor 110 relative to the second conductor 112 to balance the skew effects.

In various embodiments, such as when similar diameter conductors 110, 112 are used, when comparing the first and second conductors 110, 112, the symmetry of the first and second conductors 110, 112 (for example, same diameter and/or same volume of metal for transmitting signals), the symmetry of the insulator 114 around the conductors 110, 112 and the symmetry of the shield structure around the conductors 110, 112 eliminates skew imbalance in the electrical cable 100. Having the same diameter conductors 110, 112 leads to substantially equal inductance in the conductors 110, 112 along the length of the electrical cable 100. Using the metalized dielectric core conductors 110, 112 allows for precise diameter control of the conductors 110, 112 (for example, to achieve dimensionally equivalent conductors 110, 112) to achieve skew matching for the signals. Even with embodiments utilizing intentionally different diameter conductors 110, 112 (for example, when the air void 140 is offset closer to the first conductor 110), the manufacturing process for the metallized dielectric core conductors 110, 112 may be precisely controlled to achieve the targeted diameters for the conductors 110, 112 designed to specifically offset the effects of the air void 140.

Manufacturing the first and second cores 200, 220 to such tight tolerances (for example, compared to diameter tolerances achieved in extruded or drawn copper wires) provides a reliable substrate or base to apply the first and second conductive layers 202, 222 onto the first and second cores 200, 220. Thus, the transmission paths for the conductors 110, 112 (the first and second conductive layers 202, 222) have targeted inductances (for example, symmetrical and matched inductances) allowing the signals to transmit along the length of the electrical cable 100 at the same speed, leading to zero or near zero skew imbalance. Having the shield structure symmetrically positioned relative to the first and second conductors 110, 112 leads to similar capacitance of the first conductor 110 as compared to the second conductor 112. However, if the shield structure is offset, such as with the air void 140 at one side closer to the first conductor 110, the diameter of the first conductor 110 can be intentionally made larger than the second conductor 112 to a targeted difference with high precision within the narrow tolerance range achieved by the metallized dielectric core conductors 110, 112 to achieve targeted inductance imbalance to offset the effects of the air void on the capacitance for a zero or near zero skew imbalance through the electrical cable 100. Having the insulator 114 symmetrically positioned around the first and second conductors 110, 112 leads to similar inductance of the first conductor 110 as compared to the second conductor 112. However, the insulator 114 may be intentionally thicker around one conductor or the other to offset for other skew imbalance factors, such as having the air void offset closer to the first conductor 110. Thus, the delay (square root of inductance times capacitance) is similar or the same in the first conductor 110 as in the second conductor 112 leading to zero or near-zero skew.

Figure 3:
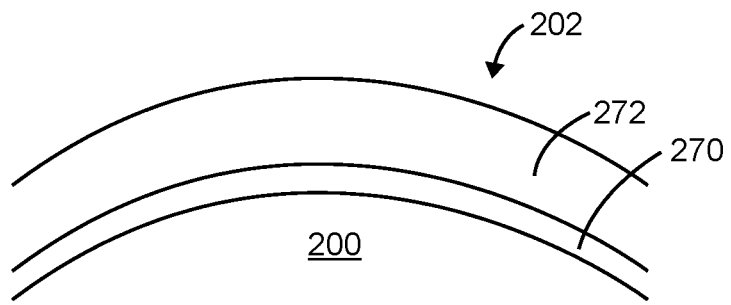
FIG. 3 is a cross-sectional view of a portion of a conductor of the conductor assembly in accordance with an exemplary embodiment.

FIG. 3 is a cross-sectional view of a portion of the first conductor 110 in accordance with an exemplary embodiment. The first conductor 110 includes the first core 200 and the first conductive layer 202. In the illustrated embodiment, the first conductive layer 202 includes a seed layer 270 and a plating layer 272. The seed layer 270 is applied to the first core 200. The plating layer 272 is formed on the seed layer 270.

Figure 4:
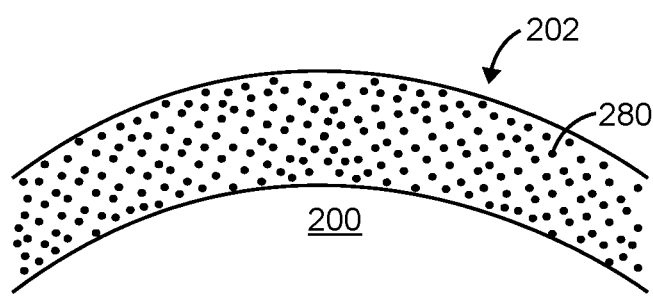
FIG. 4 is a cross-sectional view of a portion of a conductor of the conductor assembly in accordance with an exemplary embodiment.

FIG. 4 is a cross-sectional view of a portion of the first conductor 110 in accordance with an exemplary embodiment. The first conductor 110 includes the first core 200 and the first conductive layer 202. In the illustrated embodiment, the first conductive layer 202 includes conductive particles 280 on the first core 200. In various embodiments, the conductive particles 280 are conductive ink particles applied to the first core 200. In other various embodiments, the conductive particles 280 are metal particles sprayed onto the first core 200.

Figure 5:
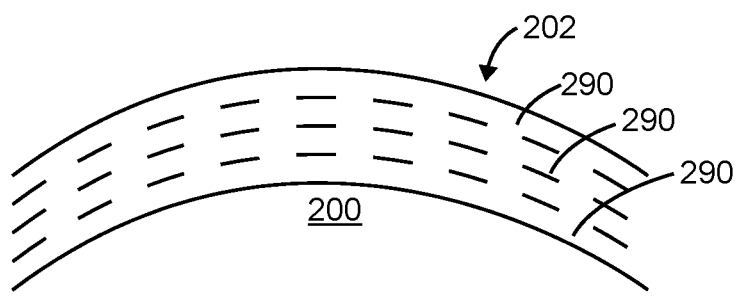
FIG. 5 is a cross-sectional view of a portion of a conductor of the conductor assembly in accordance with an exemplary embodiment.

FIG. 5 is a cross-sectional view of a portion of the first conductor 110 in accordance with an exemplary embodiment. The first conductor 110 includes the first core 200 and the first conductive layer 202. In the illustrated embodiment, the first conductive layer 202 includes multiple layers 290 built up on the outer surface 204 of the first core 200. The multiple layers 290 may be dip coated layers in various embodiments. Having additional layers adds thickness to the first conductive layer 202 to control the volume of conductive material in the first conductive layer 202.

FIG. 6 is a cross-sectional view of the conductor assembly 102 in accordance with an exemplary embodiment. In the alternative embodiment shown in FIG. 6, the insulator 114 is formed by two separate insulator members 113, 115 that are pressed together in the core of the conductor assembly 102 to form the insulator 114 for the conductor assembly 102. The insulator members, also referred to hereinafter as a first insulator 113 and a second insulator 115, are surrounded by the cable shield 120. The first insulator 113 holds the first conductor 110 and the second insulator 115 holds the second conductor 112.

The cable shield 120 is wrapped around the first and second insulators 113, 115 in the cable core. The overlapping portion of the cable shield 120 forms a seam along a seam side of the electrical cable 100. In the illustrated embodiment, the seam side is at the first insulator 113 closer to the first conductor 110 and further from the second insulator 115 and second conductor 112. In various embodiments, the void 140 is a pocket of air defined between the interior 126 of the elevated segment 142 of the cable shield 120 and the first insulator 113. The void 140 may be referred to hereinafter as an air void 140. However, in other various embodiments, the void 140 may be filled with another material, such as adhesive or other dielectric material. The volume of the air (or other dielectric material) in the void 140 affects the electrical characteristics of the nearest conductor, such as the first conductor 110, by changing the effective dielectric constant of the dielectric material between the first conductor 110 and the conductive layer 122 of the cable shield 120.

The air in the void 140 and/or moving the elevated segment 142 farther from the first conductor 110 decreases the capacitance to ground of the first conductor 110, which speeds up the signals in the first conductor 110, leading to a skew imbalance for the electrical cable 100 compared to the second conductor 112. While it may be desirable to reduce the volume of the void 140, the presence of the void 140 is inevitable when the electrical cable 100 is assembled due to the flap 134 overlapping the segment 136.

The air in the void 140 leads to a skew imbalance for the first conductor 110 by changing the effective dielectric constant of the dielectric material around the first conductor 110, compared to the second conductor 112. For example, signals transmitted by the first conductor 110 may be transmitted faster than the signals transmitted by the second conductor 112, leading to skew in the differential pair. Signal delay in the conductor is a function of inductance and capacitance of the conductor. Delay is the square root of inductance times capacitance. The speed of the signal in the conductor is the inverse of the delay, and is thus also a function of inductance and capacitance. Capacitance of the first conductor 110 is lowered by the void 140 due to its change on the effective dielectric constant. Capacitance of the first conductor 110 is lowered because the cable shield 120 along the void 140 (for example, the flap 134) is shifted farther away from the first conductor 110 along the void 140.

In various embodiments, decrease in capacitance of the first conductor 110, due to the void 140, is compensated with a proportional increase in inductance in the first conductor 110 to keep the delay similar to the signal in the second conductor 112 and thus mitigate skew imbalance. In an exemplary embodiment, the inductance of the first conductor 110 is increased by decreasing the diameter of the first conductor 110 compared to the second conductor 112. Manufacturing the first and second conductors 110, 112 by metalizing dielectric cores allows for tight control of the relative diameters within a tight tolerance to the target diameters of the first and second conductors 110, 112, particularly as compared to manufacturing of conductors by extruding metal cores as with conventional electrical cables. The first conductor 110 may be manufactured to a target diameter within a small tolerance and the second conductor 112 may be manufactured to a target diameter, different than the target diameter for the first conductor 110, but still within a small tolerance controllable due to the diameter control of manufacturing the first and second cores 200, 220.

In various embodiments, decrease in capacitance of the first conductor 110, due to the void 140, is compensated with a proportional increase in inductance in the first conductor 110 to keep the delay similar to the signal in the second conductor 112 and thus mitigate skew imbalance. In an exemplary embodiment, the inductance of the first conductor 110 is increased by increasing the diameter of the first insulator 113 compared to the second insulator 115. The inductance of the first conductor 110 may be increased by increasing the shield distance between the first conductor 110 compared to the second conductor 112, such as by moving the cable shield further from the first conductor 110 by increasing the thickness of the first insulator 113.

In FIG. 6, the conductor assembly 102 is provided with the first and second insulators 113, 115 of the insulator structure 115 being separate insulators engaging and fully surrounding the first and second conductors 110, 112, respectively. The first insulator 113 may be molded, extruded or otherwise formed with the first conductor 110 and the second insulator 115 may be molded, extruded or otherwise formed with the second conductor 112 separately from the first insulator 113 and the first conductor 110. The first and second conductors 110, 112 may be manufactured as described above with the first and second cores 200, 220, respectively, and with the first and second conductive layers 202, 222, respectively. The first and second insulators 113, 115 engage one another along a seam that is located between the conductors 110, 112.

In an example, the conductor assembly 102 shown in FIG. 6 may be formed by forming or providing the dielectric cores 200, 220, forming or providing the conductive layers 202, 222 (such as by metalizing the dielectric cores 200, 220), applying the first and second insulators 113, 115 (such as by extrusion) to the respective first and second conductors 110, 112, independently, to form two insulated wires. The insulators 113, 115 of the two insulated wires are then pressed into contact with one another, and optionally bonded to one another, at the seam, and subsequently collectively surrounded by the cable shield 120.

In various embodiments, the outer perimeters of the insulators 113, 115 are identical. For example, the first and second insulators 113, 115 have equal diameters. However, in alternative embodiments, the insulators 113, 115 may be asymmetrical, such as having different diameters. In various embodiments, the first and second conductors 110, 112 are asymmetrical. For example, the diameters 206, 226 may be different. The first diameter 206 may be slightly smaller than the second diameter 226 to compensate for the air void 140 to balance skew.

In the illustrated embodiment, the void 140 is positioned along the first segment 240, such as at a section between the second side 236 and the outer end 232. The elevated segment 142 is thus defined along the first segment 240. The flap 134 wraps around a portion of the first insulator 113, such as from the elevated segment 142 to the outer edge 132. The void 140 affects the electrical characteristics of the signals transmitted by the first conductor 110. For example, the void 140 decreases capacitance of the first conductor 110 by introducing air in the shield space, which has a lower dielectric constant than the dielectric material of the first insulator 113. The decrease in capacitance affects the delay, and thus the speed of the signals transmitted by the first conductor 110, which has a skew effect on the signals transmitted by the first conductor 110, relative to the signals transmitted by the second conductor 112. For example, the skew may be affected by having the signals travel faster in the first conductor 110 compared to a hypothetical situation in which no void 140 were present. Thus, the void 140 leads to skew problems in the conductor assembly 102.

The first conductor 110 and/or the first insulator 113 may be modified (for example, compared to the second conductor 112 and/or the second insulator 115) to balance or correct for the skew imbalance, such as to improve the skew imbalance. The first insulator 110 and/or the first insulator 113 may be modified to allow for a zero skew or near-zero skew in the conductor assembly 102. In various embodiments, the positioning of the first conductive layer 202 relative to the cable shield 120 is different (for example, positioned further apart) than the distance between the second conductive layer 222 and the cable shield 120. Changing one or both of the diameters 206, 226 changes the respective shield distances, which affects the skew and may be used to balance the skew in the first conductor 110 compared to the second conductor 112. In various embodiments, the first diameter 206 of the first conductor 110 is reduced (for example, compared to the second conductor 112) to slow the signal transmission in the first conductor 110 to balance the skew. For example, the target diameter of the first core 200 may be smaller than the target diameter of the second core 220, and thus the relative diameters of the first and second conductive layers 202, 222 are likewise different. Because the diameters of the cores 200, 220 may be precisely controlled, such as to a much tighter tolerance than conventional, extruded metal wires, the diameters 206, 226 may be more tightly controlled. In various embodiments, the thickness of the first insulator 113 may be increased (for example, compared to the second insulator 115) to slow the signal transmission in the first conductor 110 to balance skew.

In an exemplary embodiment, the first conductor 110 is modified compared to the second conductor 112 to balance or correct for the skew imbalance, such as to improve the skew imbalance. The first conductor 110 is modified to allow for a zero skew or near-zero skew in the conductor assembly 102. In various embodiments, the diameter 206 of the first conductor 110 is decreased compared to the second conductor 112 to create a proportional increase in the inductance in the first conductor 110 to compensate for the decrease in capacitance and keep the delay similar to the second conductor 112 and eliminate skew. The decrease in the diameter 206 of the first conductor 110 is used to balance the delay per unit length compared to the second conductor 112. The first diameter 206 is selected to balance skew effects of the void 140 on the first conductor 110 compared to the second conductor 112 along the length of the electrical cable 100. Even though the first and second sides have different capacitances, due to the void 140 only being present on the first side and absent on the second side, the first and second sides have different inductances, due to the different diameters of the first and second conductors 110, 112, leading to a balanced speed of the signals in the first and second conductors 110, 112 to have a zero or near-zero skew imbalance along the length of the electrical cable 100. While the effects are described with reference to a decrease in the diameter of the first conductor 110, a similar result may be achieved by increasing the diameter of the second conductor 112.

In an exemplary embodiment, the first insulator 113 is modified compared to the second insulator 115 to balance or correct for the skew imbalance, such as to improve the skew imbalance. The first insulator 113 is modified to allow for a zero skew or near-zero skew in the conductor assembly 102. In various embodiments, the thickness of the first insulator 113 is increased compared to the second insulator 115 to create a proportional increase in the inductance in the first conductor 110 to compensate for the decrease in capacitance due to the void 140 and keep the delay similar to the second conductor 112 and eliminate skew. The increase in the thickness of the first insulator 113 is used to balance the delay per unit length compared to the second conductor 112.

In the illustrated embodiment, the second side does not include any void like the void 140. The second conductor 112 is thus not subjected to the same delay change as the first conductor 110 from the void 140. When comparing the first and second conductors 110, 112, the void 140 creates a skew imbalance between the first and second conductors 110, 112 by decreasing capacitance of the first conductor 110 as compared to the second conductor 112, which affects the velocity or speed of the signal transmission through the first conductor 110 as compared to the second conductor 112. However, the first conductor 110 and/or the first insulator 113 may be modified to compensate for the void 140.

In an exemplary embodiment, the first conductor 110 may be targeted and designed to have a smaller diameter 206 than the target diameter 226 of the second conductor 112, which increases inductance of the first conductor 110 as compared to the second conductor 112, which affects the velocity or speed of the signal transmission through the first conductor 110 as compared to the second conductor 112. Because the diameters 206, 226 may be precisely controlled by using metalized dielectric cores rather than extruded or drawn metal wires, the skew may be more tightly controlled to achieve zero or near zero signal delay in the electrical cable 100 as compared to electrical cables manufactured using extruded or drawn metal wires.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

What is claimed is:

1. An electrical cable comprising:
a conductor assembly having a first conductor, a second conductor and an insulator surrounding the first conductor and the second conductor, the insulator having an outer surface, the conductor assembly extending along a longitudinal axis for a length of the electrical cable, the first conductor having a first core and a first conductive layer on the first core, the second conductor having a second core and a second conductive layer on the second core, the first and second cores being dielectric; and
a cable shield around the conductor assembly engaging the outer surface of the insulator and providing electrical shielding for the first and second conductors, the cable shield extending along the longitudinal axis.

2. The electrical cable of claim 1, wherein the first and second cores have first and second diameters within a tolerance less than +/−5 microns of targeted first and second diameters, respectively.

3. The electrical cable of claim 1, wherein the first and second cores have first and second diameters within a tolerance less than +/−1.0 microns of targeted first and second diameters, respectively.

4. The electrical cable of claim 1, wherein the first and second conductors transmit differential signals on the first and second conductive layers along outer surfaces of the first and second cores.

5. The electrical cable of claim 1, wherein the first and second cores are glass.

6. The electrical cable of claim 1, wherein the first and second cores are fiber optic cables.

7. The electrical cable of claim 6, wherein the fiber optic cables of the first and second cores are configured to convey optical signals along the length of the electrical cable.

8. The electrical cable of claim 1, wherein the first and second conductors are extruded with the insulator.

9. The electrical cable of claim 1, wherein the first conductive layer is a metalized layer on the first core and the second conductive layer is a metalized layer on the second core.

10. The electrical cable of claim 1, wherein the first conductive layer includes multiple layers built up on an outer surface of the first core and the second conductive layer includes multiple layers built up on an outer surface of the second core.

11. The electrical cable of claim 1, wherein the first conductive layer includes a seed layer applied to the first core and a plating layer built on the seed layer and the second conductive layer includes a seed layer applied to the second core and a plating layer built on the seed layer.

12. The electrical cable of claim 1, wherein the first conductive layer includes conductive ink particles applied to the first core to form the first conductive layer and the second conductive layer includes conductive ink particles applied to the second core to from the second conductive layer.

13. The electrical cable of claim 1, wherein the first conductive layer includes metal particles sprayed onto the first core to form the first conductive layer and the second conductive layer includes metal particles sprayed onto the second core to from the second conductive layer.

14. The electrical cable of claim 1, wherein the first conductive layer includes a conductive dip coating on the first core and the second conductive layer includes a conductive dip coating on the second core.

15. The electrical cable of claim 1, wherein the cable shield is wrapped around the conductor assembly, the cable shield includes an inner edge and an outer edge, the outer edge wrapped over the inner edge forming a void at the inner edge.

16. The electrical cable of claim 1, wherein the first and second conductors have dimensionally equivalent diameters within a tolerance less than +/−1.0 microns of each other.

17. The electrical cable of claim 1, wherein the insulator includes a first insulator member surrounding the first conductor and a second insulator member surrounding the second conductor, the first and second insulator members being discrete structures.

18. An electrical cable comprising:
a first conductor having a first dielectric core having an outer surface, the first conductor having a first conductive layer applied to the outer surface of the first dielectric core;
a second conductor having a second dielectric core having an outer surface, the second conductor having a second conductive layer applied to the outer surface of the second dielectric core;
an insulator surrounding the first conductor and the second conductor, the insulator engaging the first conductive layer, the insulator engaging the second conductive layer; and
a cable shield around the insulator engaging the outer surface of the insulator and providing electrical shielding for the first and second conductors.

19. The electrical cable of claim 18, wherein the first and second dielectric cores have first and second diameters within a tolerance less than +/−1.0 microns of targeted first and second diameters, respectively.

20. The electrical cable of claim 18, wherein the first and second conductors have dimensionally equivalent diameters within a tolerance less than +/−1.0 microns of each other.

21. The electrical cable of claim 18, wherein the insulator includes a first insulator member surrounding the first conductor and a second insulator member surrounding the second conductor, the first and second insulator members being discrete structures.

22. The electrical cable of claim 18, wherein the first and second cores are fiber optic cables.

23. An electrical cable comprising:
a first conductor having a first core having an outer surface having a first diameter, the first conductor having a first conductive layer applied to the outer surface of the first core, wherein the first diameter has a tolerance less than +/−1.0 microns of a targeted diameter;
a second conductor having a second core having an outer surface having a second diameter, the second conductor having a second conductive layer applied to the outer surface of the second core, wherein the second diameter has a tolerance less than +/−1.0 microns of a targeted diameter;
an insulator surrounding the first conductor and the second conductor, the insulator engaging the first conductive layer, the insulator engaging the second conductive layer; and
a cable shield around the insulator engaging the outer surface of the insulator and providing electrical shielding for the first and second conductors.

24. The electrical cable of claim 23, wherein the first and second conductors have dimensionally equivalent diameters.

* * * * *